US012801027B2

(12) United States Patent
Weber et al.

(10) Patent No.: US 12,801,027 B2
(45) Date of Patent: Nov. 17, 2026

(54) MIRROR, IN PARTICULAR FOR A MICROLITHOGRAPHIC PROJECTION EXPOSURE SYSTEM

(71) Applicant: Carl Zeiss SMT GmbH, Oberkochen (DE)

(72) Inventors: Joern Weber, Aalen (DE); Sandra Deppisch, Aalen (DE); Martin Lilienblum, Oberkochen (DE); Ramona Stirner, Neuler (DE); Johanna Hackl, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 183 days.

(21) Appl. No.: 18/947,058

(22) Filed: Nov. 14, 2024

(65) Prior Publication Data

US 2025/0068084 A1 Feb. 27, 2025

Related U.S. Application Data

(63) Continuation of application No. PCT/EP2023/062441, filed on May 10, 2023.

(30) Foreign Application Priority Data

May 25, 2022 (DE) ..................... 10 2022 205 302.8

(51) Int. Cl.
*G03F 7/00* (2006.01)

(52) U.S. Cl.
CPC ...... *G03F 7/70316* (2013.01); *G03F 7/70266* (2013.01); *G03F 7/70958* (2013.01)

(58) Field of Classification Search
CPC ........ G02B 5/208; G02B 1/115; G02B 5/282; G02B 5/0891; G02B 5/285;
(Continued)

(56) References Cited

U.S. PATENT DOCUMENTS

| | | | |
|---|---|---|---|
| 9,442,383 | B2 | 9/2016 | Dinger et al. |
| 9,785,054 | B2 | 10/2017 | Gruner et al. |

(Continued)

FOREIGN PATENT DOCUMENTS

| | | | |
|---|---|---|---|
| DE | 102007028800 | A1 | 12/2008 |
| DE | 102011081603 | A1 | 10/2012 |

(Continued)

OTHER PUBLICATIONS

International Search Report, PCT/EP2023/062441, Aug. 16, 2023, 5 pages.

(Continued)

*Primary Examiner* — Henry Duong
(74) *Attorney, Agent, or Firm* — Edell, Shapiro & Finnan, LLC

(57) ABSTRACT

A mirror, in particular for a microlithographic projection exposure system, having an active optical surface, a reflective layer system for reflecting electromagnetic radiation of a working wavelength which is incident on the active optical surface, a mirror substrate (105, 205, 305) which is made of a mirror substrate material and in which structures (106, 206, 306) are arranged that differ from the surrounding mirror substrate material in terms of the refractive index, and a layer stack which is located between the mirror substrate (105, 205, 305) and the reflective layer system. The layer stack has an absorber layer (110, 210, 310) an AR layer (120, 220, 320) and a smoothing layer (130, 230, 330) one after the other in a stacking direction running from the mirror substrate (105, 205, 305) to the reflective layer system.

18 Claims, 11 Drawing Sheets

(58) Field of Classification Search
CPC .............. G02B 26/0825; G02B 5/0816; G03F 7/70316; G03F 7/70266; G03F 7/70958
USPC .......................................................... 359/359
See application file for complete search history.

(56) References Cited

U.S. PATENT DOCUMENTS

| | | | |
|---|---|---|---|
| 9,997,268 | B2 | 6/2018 | Dinger et al. |
| 10,474,036 | B2 | 11/2019 | Paul et al. |
| 11,360,393 | B2 | 6/2022 | Wylie-Van Eerd et al. |
| 2008/0318139 | A1 | 12/2008 | Dersch et al. |
| 2011/0149262 | A1 | 6/2011 | Van Herpen et al. |
| 2012/0182606 | A1 | 7/2012 | Weissenrieder et al. |
| 2020/0026195 | A1* | 1/2020 | Lippert ................ G02B 5/0891 |
| 2020/0174379 | A1 | 6/2020 | Wylie-Van Eerd et al. |
| 2020/0225571 | A1 | 7/2020 | Schedel et al. |
| 2020/0309995 | A1 | 10/2020 | Wells et al. |
| 2021/0055662 | A1 | 2/2021 | Hild et al. |
| 2021/0149310 | A1 | 5/2021 | Lippert et al. |
| 2022/0113634 | A1 | 4/2022 | Stiepan et al. |
| 2023/0088791 | A1 | 3/2023 | Horn et al. |
| 2023/0122333 | A1 | 4/2023 | Hild et al. |

FOREIGN PATENT DOCUMENTS

| | | | |
|---|---|---|---|
| DE | 102011084649 | A1 | 4/2013 |
| DE | 102014204171 | A1 | 9/2015 |
| DE | 102015208214 | A1 | 12/2015 |
| DE | 102015213273 | A1 | 1/2017 |
| DE | 102016224202 | A1 | 1/2017 |
| DE | 102017217695 | A1 | 6/2018 |
| DE | 102017205405 | A1 | 10/2018 |
| DE | 102017213900 | A1 | 2/2019 |
| DE | 102018212508 | A1 | 1/2020 |
| DE | 102019100839 | A1 | 7/2020 |
| DE | 102019208934 | A1 | 12/2020 |
| DE | 102020206708 | A1 | 12/2021 |
| DE | 102020207699 | A1 | 12/2021 |
| EP | 2463693 | A2 | 6/2012 |
| EP | 3323130 | B1 | 6/2019 |
| WO | 2013057046 | A1 | 4/2013 |
| WO | 2017009005 | A1 | 1/2017 |
| WO | 2019214946 | A1 | 11/2019 |

OTHER PUBLICATIONS

German Office Action with English translation, Application No. DE 10 2022 205 302.8, Dec. 5, 2022, 14 pages.
International Preliminary Report on Patentability and the Written Opinion, PCT/EP2023/062441, Nov. 7, 2024, 17 pages.

* cited by examiner

Prior art

MIRROR, IN PARTICULAR FOR A MICROLITHOGRAPHIC PROJECTION EXPOSURE SYSTEM

CROSS REFERENCE TO RELATED APPLICATIONS

This is a Continuation of International Application PCT/EP2023/062441 which has an international filing date of May 10, 2023, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2022 205 302.8 filed on May 25, 2022.

FIELD OF THE INVENTION

The invention relates to a mirror, in particular for a microlithographic projection exposure apparatus, and to a method of production thereof.

BACKGROUND

Microlithography is used for producing microstructured components, for example integrated circuits or LCDs. The microlithography process is conducted in a so-called projection exposure apparatus, which comprises an illumination device and a projection lens. The image of a mask (=reticle) illuminated with the illumination device is projected via the projection lens onto a substrate (e.g. a silicon wafer) coated with a light-sensitive layer (=photoresist) and disposed in the image plane of the projection lens, in order to transfer the mask structure to the light-sensitive coating of the substrate.

In projection lenses designed for the extreme ultraviolet (EUV) range, which is to say at wavelengths of for example approximately 13 nm or approximately 7 nm, mirrors are used as optical components for the imaging process owing to the lack of availability of suitable light-transmissive refractive materials.

In this case, it is also known to configure one or more mirrors in an EUV system as an adaptive mirror with an actuator layer composed of a piezoelectric material, wherein an electric field having a locally varying strength is generated across this piezoelectric layer by an electrical voltage being applied to electrodes arranged on both sides with respect to the piezoelectric layer. In the case of a local deformation of the piezoelectric layer, the reflection layer system of the adaptive mirror also deforms, with the result that (possibly also temporally variable) imaging aberrations, for example, are compensated for at least in part through suitable driving of the electrodes.

FIG. 8 shows, in a schematic illustration, a conventional construction of an adaptive mirror 10 comprising a mirror substrate 12 and a reflection layer system 21. The mirror 10 comprises a piezoelectric layer 16 (for example composed of lead zirconate titanate ($Pb(Zr,Ti)O_3$, PZT)). Electrode arrangements 14, 20 are respectively situated above and below the piezoelectric layer 16, by way of which electrode arrangements an electric field for producing a locally variable deformation is able to be applied to the mirror 10. The second electrode arrangement 14 facing the substrate 12 is configured as a continuous, planar electrode of constant thickness, whereas the first electrode arrangement 20 comprises a plurality of electrodes 20*a*, 20*b*, 20*c*, . . . , to which an electrical voltage relative to the first electrode arrangement 14 is able to be applied respectively via a supply line 19*a*, 19*b*, 19*c*, . . . . The electrodes 20*a*, 20*b*, 20*c*, . . . are embedded into a smoothing layer 18 produced from quartz ($SiO_2$), said smoothing layer also serving for leveling the electrode arrangement 20. Furthermore, the mirror 10 comprises an adhesion layer 13 (for example composed of titanium, Ti) and also a buffer layer 15 between the mirror substrate 12 and the bottom electrode 114 facing the mirror substrate 12.

During operation of an optical system comprising the mirror 10, applying an electrical voltage to the electrode arrangements 14 and 20 by way of the electric field that forms in the region of the piezoelectric layer 16 results in a deflection of said piezoelectric layer 16. In this way, it is possible to achieve an actuation of the mirror 10 (for instance for compensation of optical aberrations, for example as a result of thermal deformations in the case of EUV radiation incident on the optical effective surface 11). A mediator layer 17 is in direct electrical contact with the electrodes 20*a*, 20*b*, 20*c*, . . . (which are shown in plan view in FIG. 8 merely for illustration) and serves to "mediate" a potential between the electrodes 20*a*, 20*b*, 20*c*, . . . of the electrode arrangement 20 within the piezoelectric layer 16, wherein said mediator layer has only a low electrical conductivity (e.g. less than 200 siemens/meter (S/m)), with the consequence that a potential difference existing between adjacent electrodes 20*a*, 20*b*, 20*c*, . . . is dropped substantially across the mediator layer 17 and thus also in the piezoelectric material between the electrodes.

During the production of the adaptive mirror 10, ensuring that the reflection layer system 21 is applied while complying with the required specifications is a demanding challenge. One problem that occurs here in practice is, in particular, during the fabrication process before the reflection layer system 21 is applied, that of realizing interferometric measurements of the respective surface-processed layer without the measurement being influenced by the metallic structures of the electrode arrangement 20 and by the piezoelectric layer 16, since such influencing would result in a distortion of the interferometric measurement results and thus an inadequate usability for the material removals to be carried out in each case in the fabrication process.

FIG. 7 shows a merely schematic and much simplified representation for illustration of the problem described above. A mirror 700 has structures 706 hidden in a mirror substrate labelled "705" here (with a different refractive index from the surrounding mirror substrate material). An interface of the mirror substrate 705 with the reflection layer system that provides the optical effective surface of the mirror (not shown in FIG. 7) is labelled "701". Interferometry studies conducted for characterization of the surface form or the figure (i.e. the variance of the actual surface form from the target form) during the production of the mirror 700 include exposure to electromagnetic measurement radiation of a suitable measurement wavelength, which is typically in the visible range from 400 nm to 750 nm, where the relevant surface information is generated from the phase difference by comparison with a corresponding reference radiation or wave. However, the presence of these structures 706 with a refractive index differing from the surrounding mirror substrate material, as indicated in the region labelled "710", results in a further reflection of the measurement radiation (i.e. in the region 710 of the beam 711) at the structures 706 themselves, which gives rise in turn to further interference (namely according to FIG. 7 between the beams 712 and 713) (since the distance of the structures 706 from the optical effective surface 701 or the optical path difference between the beams 712 and 713 is less than the coherence length of the electromagnetic measurement radiation). As a result of the disruptive effect of this additional interference on the result obtained in the interferometry measurement, the figure of the mirror 700 is determined incorrectly, as a result of which mirror manufacture based on this determination of figure cannot be conducted with the required precision.

In order to overcome the problem described above, again with reference to FIG. 8, the smoothing layer, for the purpose of achieving an absorption effect, can be produced, for example, from doped quartz glass (i.e. doped $SiO_2$). However, the result of this configuration is that, firstly, variance from the ideal material for optimal processibility impairs the processibility of the smoothing layer and, secondly, high layer thicknesses are required to achieve the required functionality.

By way of prior art, reference is made merely by way of example to DE 10 2017 213 900 A1, DE 10 2015 208 214 A1 and DE 10 2014 204 171 A1.

SUMMARY

It is an object of the present invention to provide a mirror, in particular for a microlithographic projection exposure apparatus, and a method for production thereof, which make it possible to achieve higher surface quality than was possible with the prior art while still complying with the specifications required, for example in the EUV range.

This this and other objects are addressed according to the features of the independent patent claims.

A mirror according to one formulation of the invention, has an optical effective surface, and has:

- a reflection layer system for reflecting electromagnetic radiation having an operating wavelength that is incident on the optical effective surface;
- a mirror substrate that has been produced from a mirror substrate material and in which there are disposed structures of different refractive index from the surrounding mirror substrate material; and
- a layer stack present between mirror substrate and reflection layer system;
- wherein the layer stack successively has, in a stacking direction running from the mirror substrate to the reflection layer system, an absorber layer, an antireflection (AR) layer and a smoothing layer.

The present invention is associated with the concept of ensuring, in a mirror with structures (for example electrodes) hidden in the mirror substrate thereof that have different refractive index from the remainder of the mirror substrate material, by provision of a suitable layer stack between the mirror substrate and reflection layer system, that, firstly, an interferometric figure measurement that is typically required, possibly repeatedly, during mirror manufacture can be conducted without the destructive influence of these structures hidden in the mirror substrate that was described at the outset, and, secondly, the smoothing process steps that are needed during mirror manufacture (e.g. polishing) can be conducted in a very optimal manner, meaning that corresponding optical processibility remains assured.

In the layer stack provided in accordance with the invention between mirror substrate and reflection layer system, the absorber layer achieves the effect that measurement radiation penetrating into the mirror during the interferometric figure measurement mentioned is at least largely absorbed (i.e. virtually no reflected measurement radiation that disrupts the figure measurement exits from the mirror), whereas the AR layer between smoothing layer and absorber layer achieves the effect that no significant reflections occur at the transition to the absorber layer either. At the same time, the functionalities of the absorber layer and of the AR layer that have been mentioned make it possible to configure the smoothing layer even without reference to the structures hidden in the substrate and the potentially disruptive influence thereof on the interferometric figure measurement and hence to optimize it rather with regard to the smoothing (polishing) processes to be conducted for mirror manufacture.

Overall, the layer stack of the invention not only does justice to the demands for smoothability that exist from a manufacturing point of view, but at the same time prevents, during the manufacturing process, occurrence of the influences or distortions described at the outset in the measurement results obtained in the interferometry analysis of the respectively surface-processed layer by virtue of the structures hidden in the mirror substrate (for instance in the adaptive mirror described at the outset by virtue of the electrodes of the electrode arrangement and by virtue of the piezoelectric layer).

In particular, it is not necessary in accordance with the invention to undertake any manipulation of the smoothing layer by appropriate doping, in order to ensure that, in the interferometry analysis, the aforementioned metallic structures of the electrode arrangement and of the piezoelectric layer are “invisible”, since the latter functionality is achieved by the further layers that are present in the layer stack of the invention, namely the AR layer and the absorber layer.

In one embodiment, the absorber layer has transmittance of less than 10-5 for at least one measurement wavelength in the range from 400 nm to 750 nm. The term “transmittance” here and hereinafter should be considered to mean transmittance in a double pass through the layer stack (i.e. after reflection of the electromagnetic radiation in question at the absorber layer).

In one embodiment, the absorber layer has a thickness in the range from 50 nm to 2 μm.

In one embodiment, the absorber layer includes at least one material from the group comprising amorphous silicon (a-Si), non-oxidic and non-nitridic a-Si compounds, and the metals tantalum (Ta), titanium (Ti), chromium (Cr), nickel (Ni), aluminum (Al) and alloys of those metals.

In one embodiment, the smoothing layer has been produced from a material from the group comprising silicon dioxide (SiO2), SiOx compounds, hafnium dioxide (HfO2), titanium dioxide (TiO2), amorphous silicon (a-Si) and crystalline silicon (c-Si).

In one embodiment, the AR layer has an average refractive index between the average refractive index of the smoothing layer and the average refractive index of the absorber layer.

In one embodiment, the AR layer has a refractive index that rises or falls successively in stacking direction between the average refractive index of the absorber layer and the average refractive index of the smoothing layer.

In one embodiment, the AR layer has an alternating sequence of layers of comparatively low refractive index, especially of silicon dioxide ($SiO_2$), and layers of comparatively high refractive index, especially of amorphous silicon (a-Si).

In one embodiment, the mirror has a piezoelectric layer which is disposed between mirror substrate and reflection layer system and which is subjectable via electrode arrangements to an electrical field for creation of a locally variable deformation.

In accordance with one embodiment, the mirror is designed for an operating wavelength of less than 30 nm, in particular less than 15 nm. However, the invention is not restricted thereto, and so in further applications the invention can also be implemented advantageously in an optical system having an operating wavelength in the VUV range (e.g. of less than 200 nm).

In accordance with one embodiment, the mirror is a mirror for a microlithographic projection exposure apparatus.

In accordance with a further aspect, the invention also relates to a method for producing a mirror, wherein the method comprises the following steps:

- providing a mirror substrate made from a mirror substrate material, wherein there are structures formed in the mirror substrate that differ in their refractive index from the surrounding mirror substrate material;
- applying a layer stack atop the mirror substrate, wherein the layer stack successively has, in a stacking direction, an absorber layer, an AR layer and a smoothing layer; and
- applying a reflection layer system for reflecting incident electromagnetic radiation having an operating wavelength;
- wherein, during the production of the mirror, at least one interferometry pass measurement is conducted using electromagnetic measurement radiation.

The mirror may be in particular a mirror for a microlithographic projection exposure apparatus. However, the invention is not restricted thereto. In further applications, a mirror of the invention can also be employed or utilized for example in an apparatus for mask metrology.

The invention further relates to an optical system, in particular an illumination device or a projection lens of a microlithographic projection exposure apparatus, comprising at least one mirror having the features described above, and also to a microlithographic projection exposure apparatus.

Further configurations of the invention will be apparent from the description and the dependent claims.

The invention is described in detail hereinafter with reference to working examples shown in the appended figures.

DETAILED DESCRIPTION

There follows a description, first, of the structure and mode of function of a mirror according to the invention using different embodiments with reference to the schematic illustrations or diagrams of FIGS. 1A-5B.

What is common to these embodiments is that, for avoidance of troublesome influencing of interferometry measurements conducted for figure measurement by structures present in the mirror substrate that have a refractive index different than the surrounding mirror substrate material, a layer stack atop the mirror substrate is provided in each case. The layer stack, in addition to a smoothing layer that ensures optical processibility, has an absorber layer (for absorbing the electromagnetic measurement radiation that penetrates the smoothing layer) and an AR layer (for avoiding reflections of this measurement radiation at the boundary to the absorber layer).

As a result, by virtue of the aforementioned functionalities of the absorber layer and of the AR layer, the smoothing layer itself can be configured without reference to these structures hidden in the substrate and the potentially disruptive influence thereof on the interferometric figure measurement and hence can be optimized rather with regard to the smoothing (e.g. polishing) processes to be conducted for mirror manufacture.

Figure 1A:
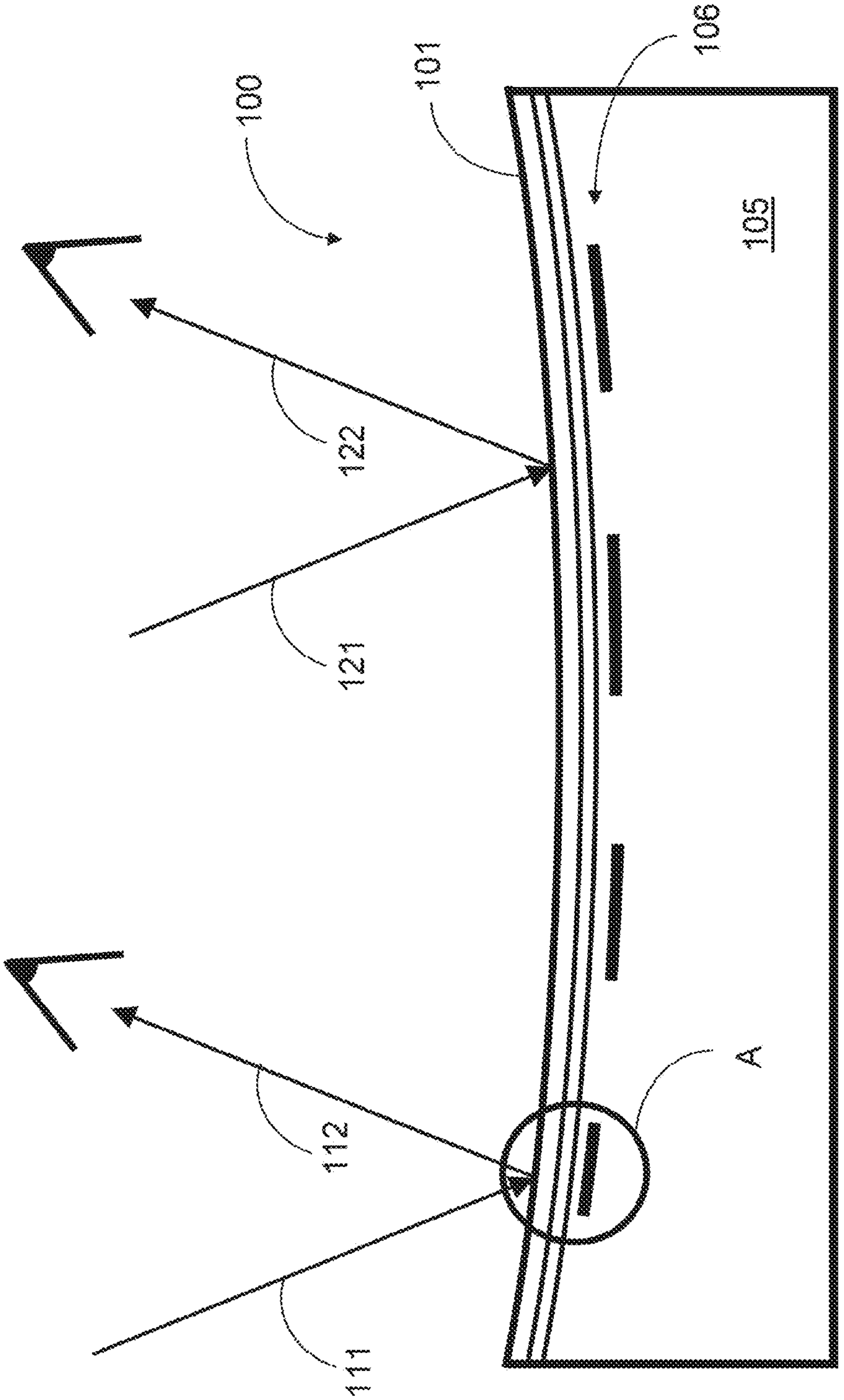
FIG. 1A a schematic diagram for illustrating a mode of action of a mirror according to the invention or a layer stack provided therein.

FIG. 1A firstly shows, in a schematic and greatly simplified illustration, the above-described mode of action with reference to an inventive mirror 100 with structures 106 hidden in the mirror substrate 105 thereof. Suitable mirror substrate materials are, for example, titanium dioxide ($TiO_2$)-doped quartz glass; such materials, merely by way of example (and without the invention being restricted thereto), are those sold under the ULE® trade name (from Corning Inc.) or Zerodur® trade name (from Schott AG).

Figure 8:
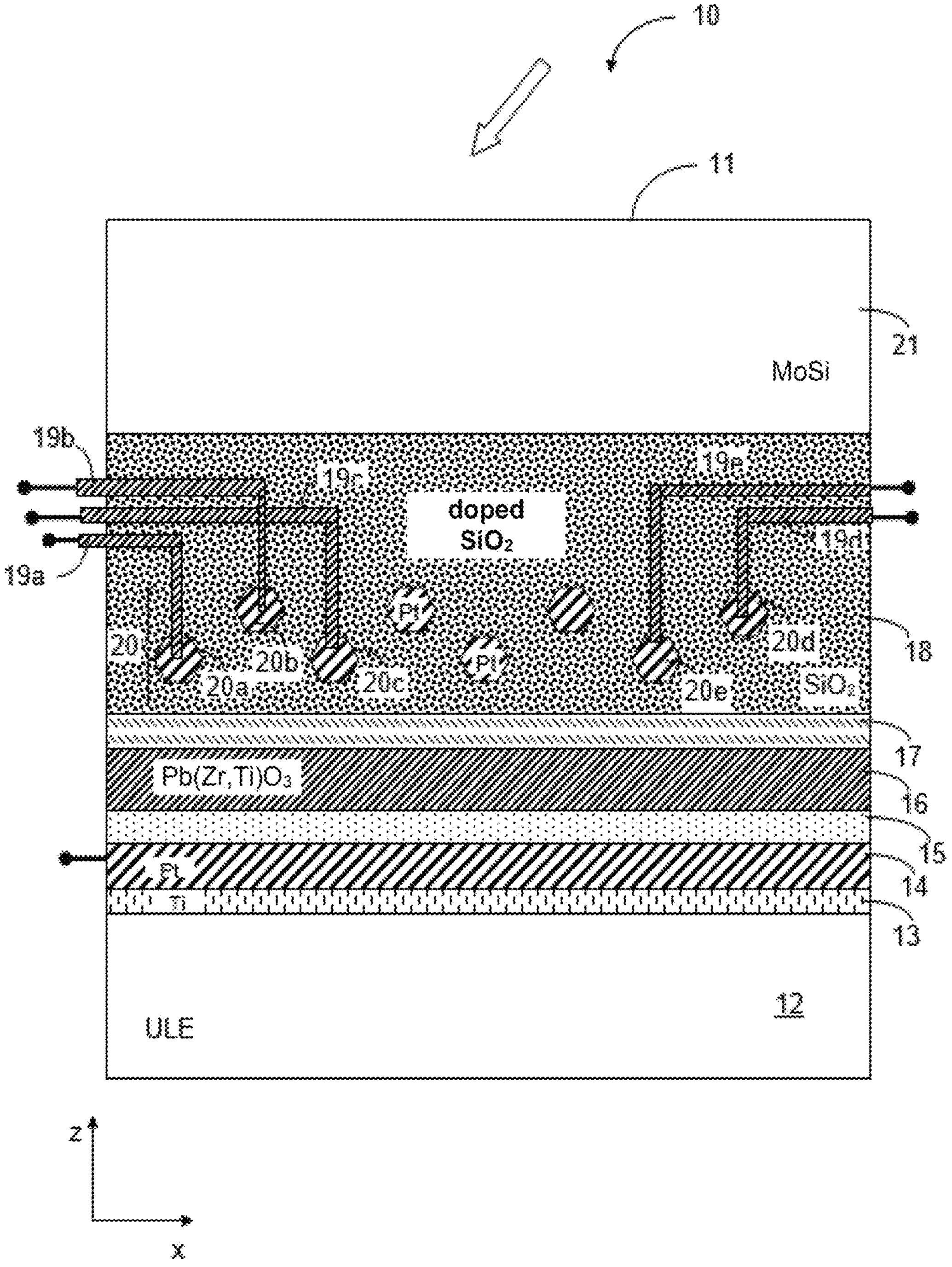
Fig. 8 Prior art
FIG. 8 a schematic diagram for describing the possible construction of an adaptive mirror according to the prior art.

The mirror 100 may be in particular an EUV mirror of an optical system, in particular of the projection lens or of the illumination device of a microlithographic projection exposure apparatus. More particularly, the mirror 100 may be an adaptive mirror with an actuator layer composed of a piezoelectric material, where an electric field having locally varying strength is generated across the piezoelectric layer—as described at the outset with reference to FIG. 8—by applying an electrical voltage to electrodes disposed on both sides of the piezoelectric layer.

In this case, the structures 106 hidden in the mirror substrate 105 may especially be the electrodes or else the piezoelectric layer.

Figure 7:
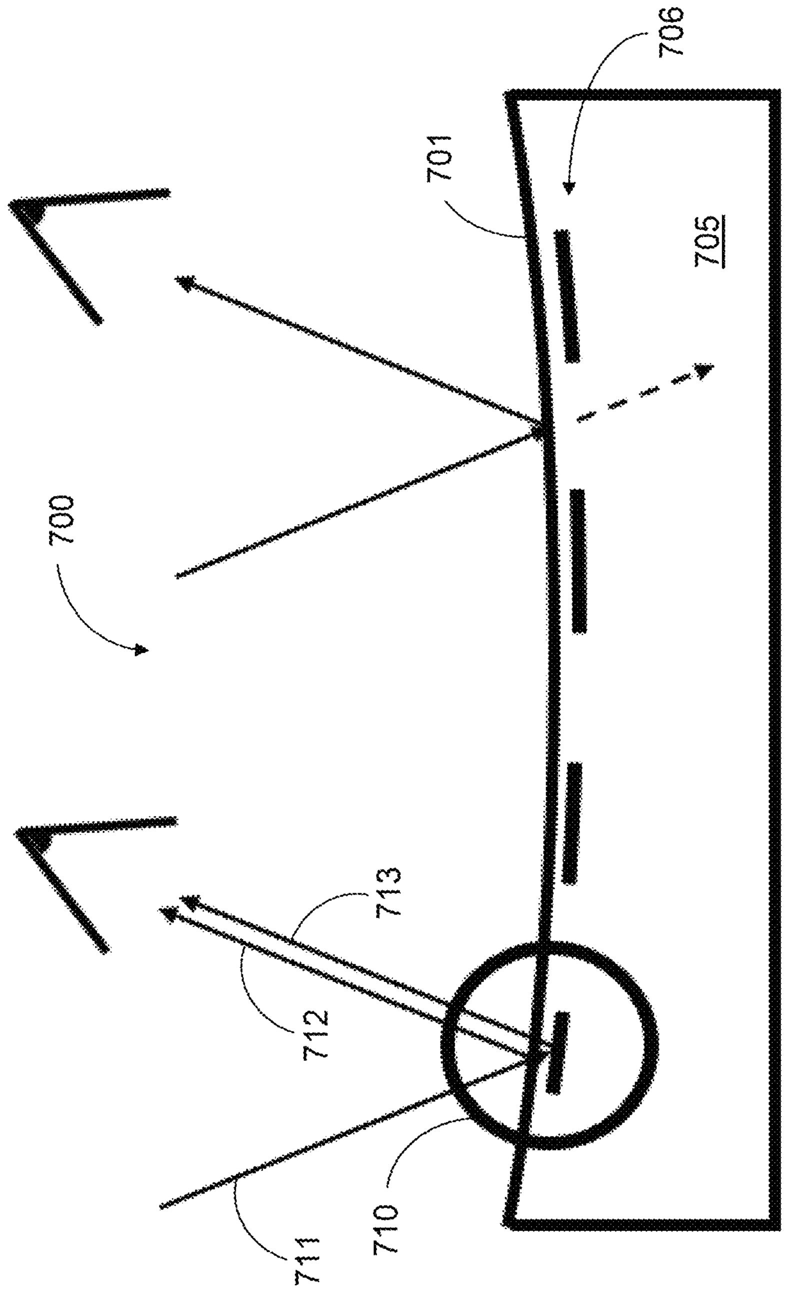
FIG. 7 a schematic diagram illustrating a problem that occurs in the interferometric characterization of the surface of a conventional mirror in the prior art.

As a result of the abovementioned layer stack of the invention described in detail hereinafter with reference to different embodiments—by contrast with the conventional arrangement of FIG. 7 that has been described by way of introduction-reflections that disrupt the interferometric figure measurement on the part of the structures 106 that are hidden in the mirror substrate 105 (for example in the region labelled "A" in FIG. 1A) are suppressed, with the result that solely the measurement rays reflected at the interface 101 between the mirror substrate 105 and the environment (for example reflected measurement rays "112" and "122", which, according to FIG. 1A, originate from incident measurement rays 111 and 121) contribute to interferometric figure measurement.

Figure 1B:
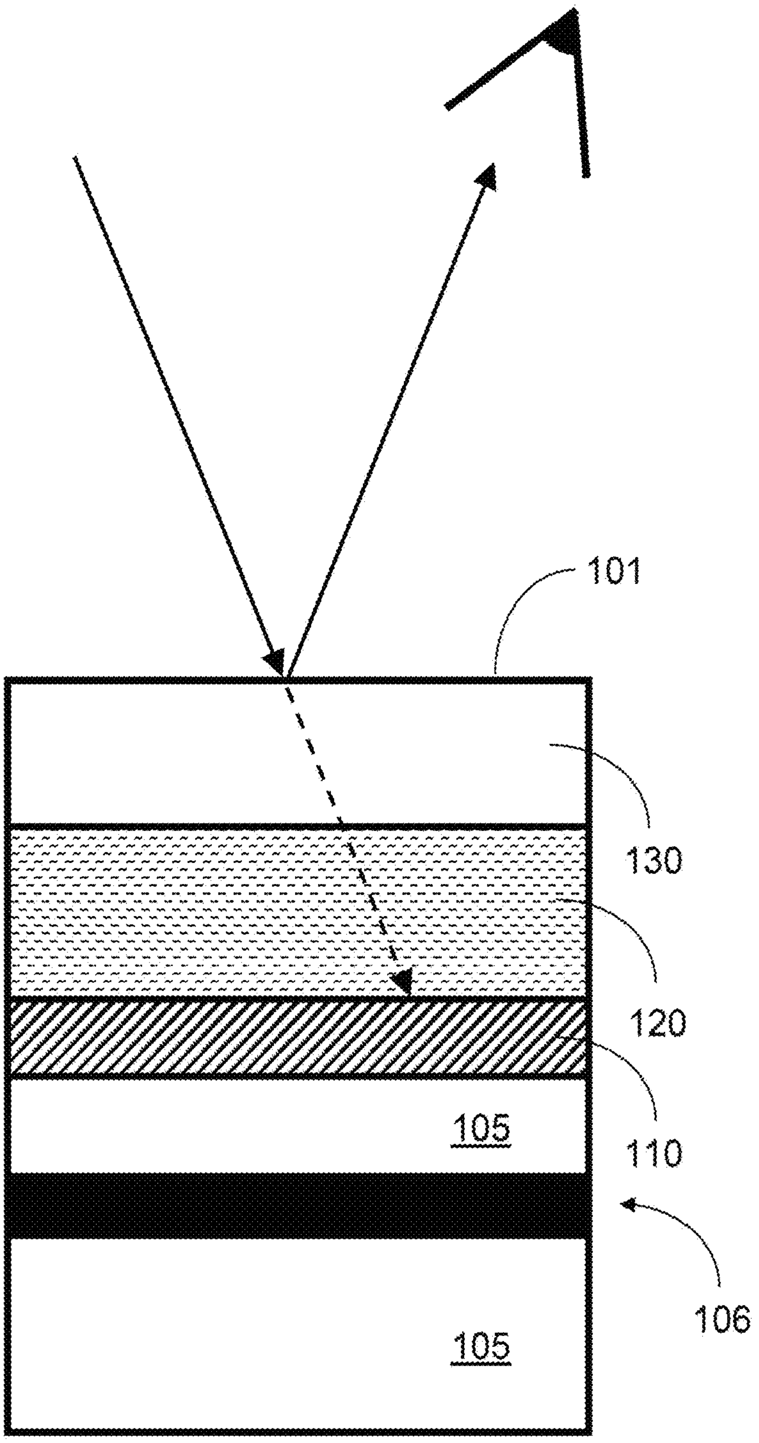
FIG. 1B a schematic diagram (detailing the region "A" of FIG. 1A) of a feasible construction of a mirror according to the invention in a first embodiment.

FIG. 1B shows, in a likewise merely schematic illustration, a feasible construction of the mirror in the region labelled "A" in FIG. 1A in a first embodiment. According to FIG. 1B, the mirror successively has, in a stacking direction that runs from the mirror substrate 105 to the interface 101 (or a reflection layer system applied thereto, for example a molybdenum-silicon (Mo-Si) layer stack), an absorber layer 110, an AR layer 120 and a smoothing layer 130.

The absorber layer 110, for the measurement wavelength used (which is typically in the visible range between 400 nm and 750 nm and may, merely by way of example, be 532 nm or 633 nm), has a transmittance of less than 10-5 and a suitable thickness, depending on the material of the absorber layer 110, for example, in the range from 50 nm to 2 μm. Illustrative suitable materials of the absorber layer are amorphous silicon (a-Si), non-oxidic and non-nitridic a-Si compounds, and the metals tantalum (Ta), titanium (Ti), chromium (Cr), nickel (Ni), aluminum (Al) as well as alloys of those metals.

The smoothing layer 130 optimized with regard to the smoothing (polishing) processes to be conducted for the mirror manufacture may especially have been produced from pure silicon dioxide (SiO2). However, the invention is not limited thereto, and so, in further embodiments, depending on the smoothing optical processing operation to be conducted, other materials are also suitable for the smoothing layer, especially SiOx compounds, hafnium dioxide (HfO2), titanium dioxide (TiO2), amorphous silicon (a-Si) and crystalline silicon (c-Si).

The AR (anti-reflection) layer 120, for achievement of the above-described functionality, namely the avoidance of reflections at the boundary to the absorber layer 110, has an average refractive index between the average refractive index of the absorber layer 110 and the average refractive index of the smoothing layer 130.

Figure 2:
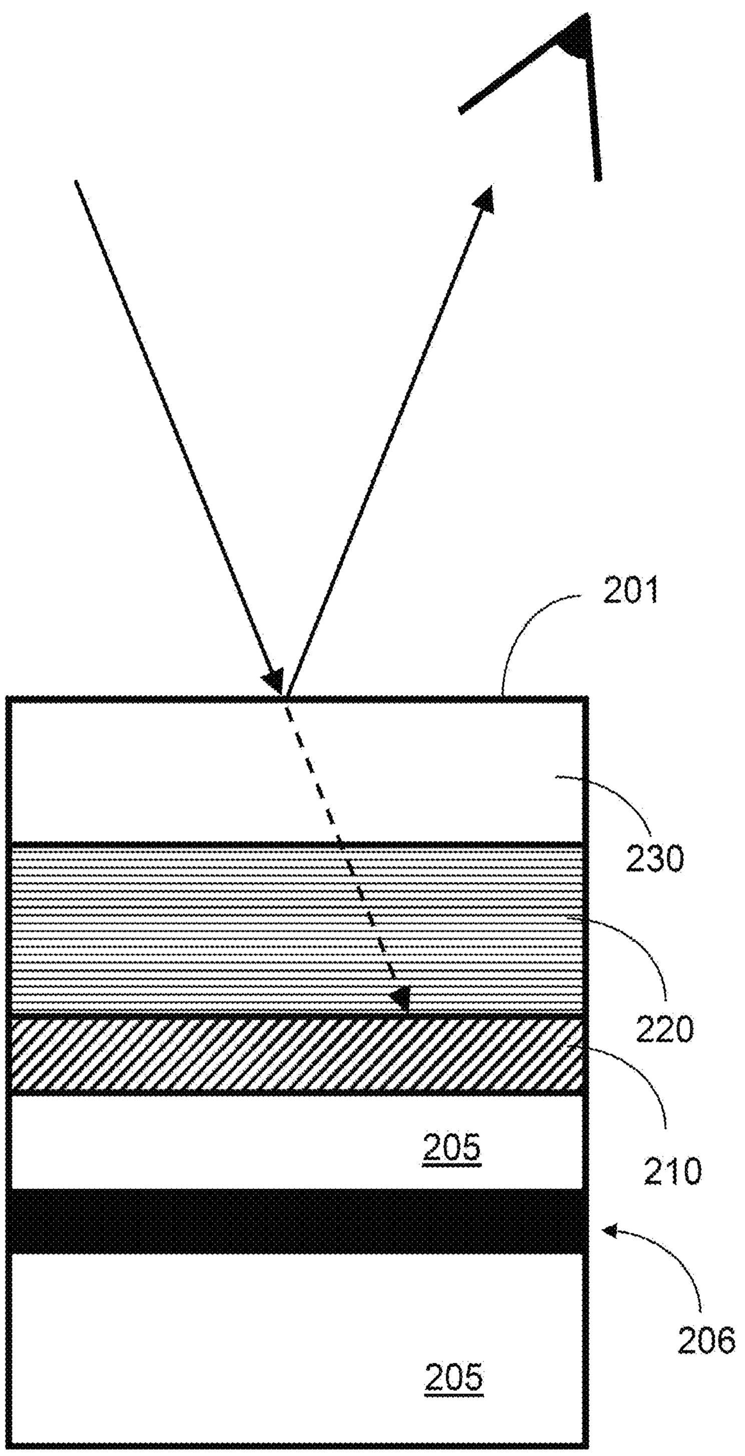
FIGS. 2, 3A and 3B schematic illustrations or diagrams for describing the construction (FIG. 2) and mode of action (with regard to refractive index progression in FIG. 3A and reflection spectrum in FIG. 3B) of a mirror according to the invention in a second embodiment, in which the refractive index rises or falls in the AR layer.

FIG. 2 shows a further embodiment in a schematic diagram, wherein components that are analogous or essentially functionally the same by comparison with FIG. 1B are labelled by reference numerals increased by "100". According to FIG. 2, the AR layer 220, by comparison with FIG. 1B, has a refractive index that rises or falls successively in stacking direction between the average refractive index of the absorber layer 210 and the average refractive index of the smoothing layer 230.

Figure 3A:
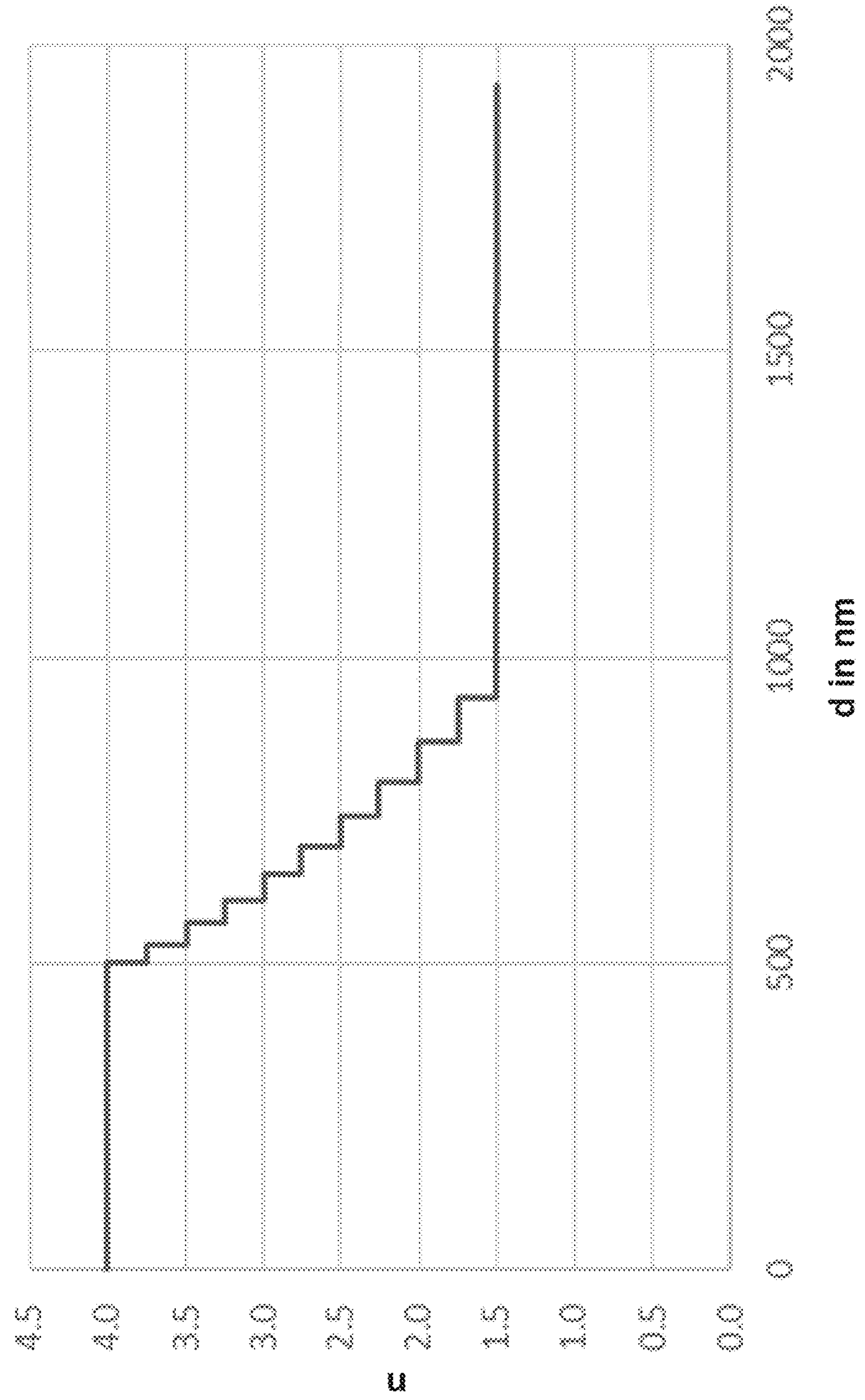
Figure 3B:
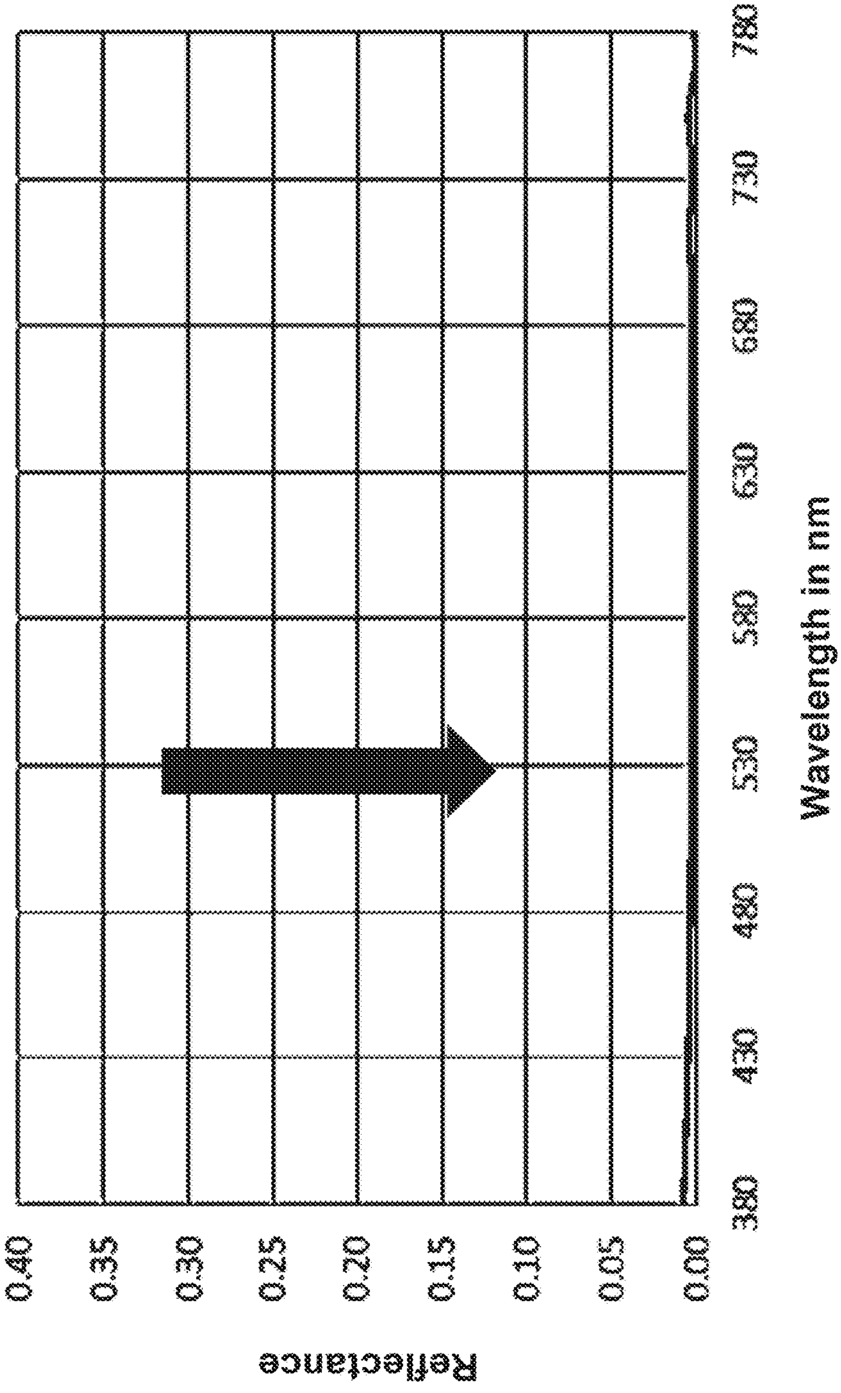

In this regard, FIG. 3A shows an illustrative refractive index progression within the layer stack, where the refractive index n, depending on thickness d, based on stacking direction, is reported from the absorber layer of comparatively high refractive index (composed of amorphous silicon here) down to the smoothing layer (composed of SiO2 here). As apparent from the reflection spectrum shown in FIG. 3B, in this embodiment, a particularly broadband AR effect is achieved, which enables larger tolerances in the layer thicknesses to be deposited with regard to mirror manufacture.

Figure 4:
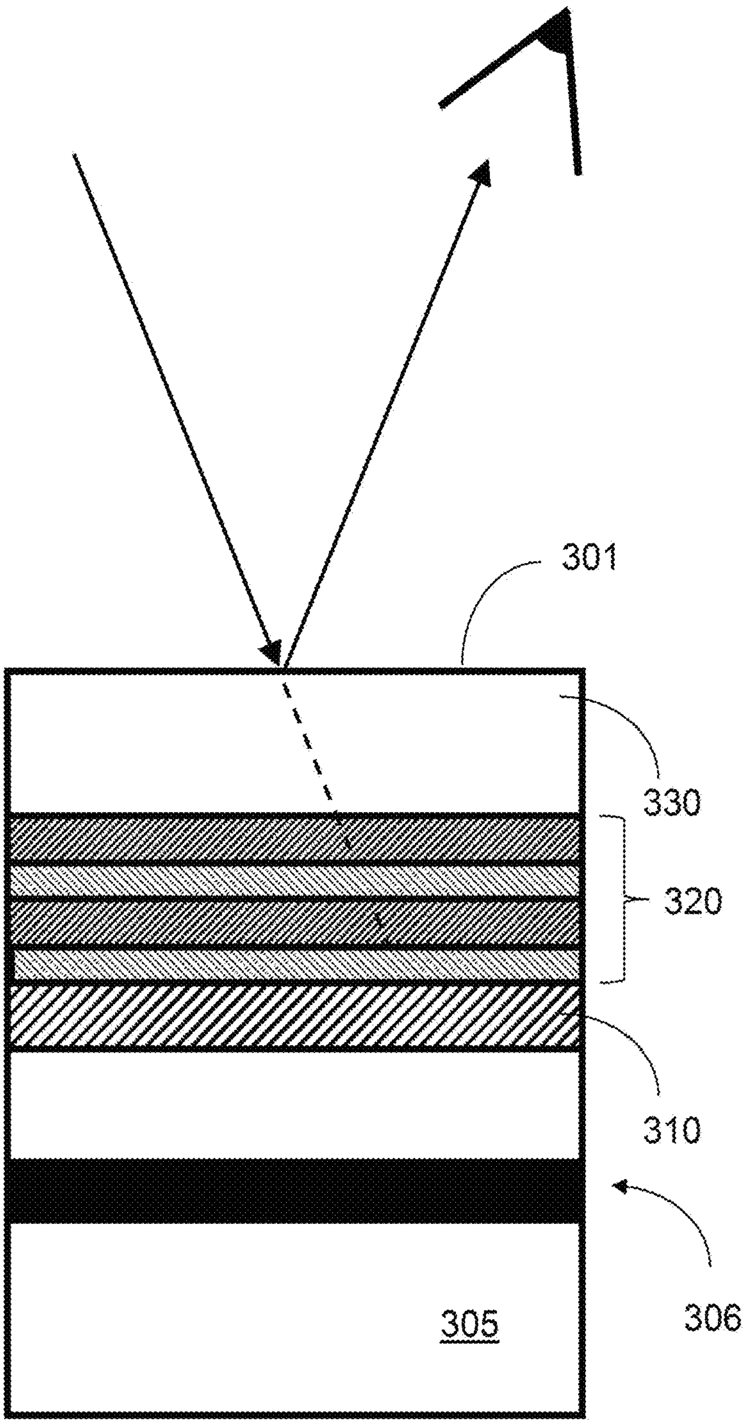
FIGS. 4, 5A and 5B schematic illustrations or diagrams for describing the construction (FIG. 4) and mode of action (with regard to refractive index progression in FIG. 5A and reflection spectrum in FIG. 5B) of a mirror according to the invention in a third embodiment, in which the refractive index alternates between layers in the AR layer.

FIG. 4 shows a further embodiment in a schematic representation, wherein in turn components that are analogous or essentially functionally the same by comparison with FIG. 2 are labelled by reference numerals increased by "100".

Figure 5A:
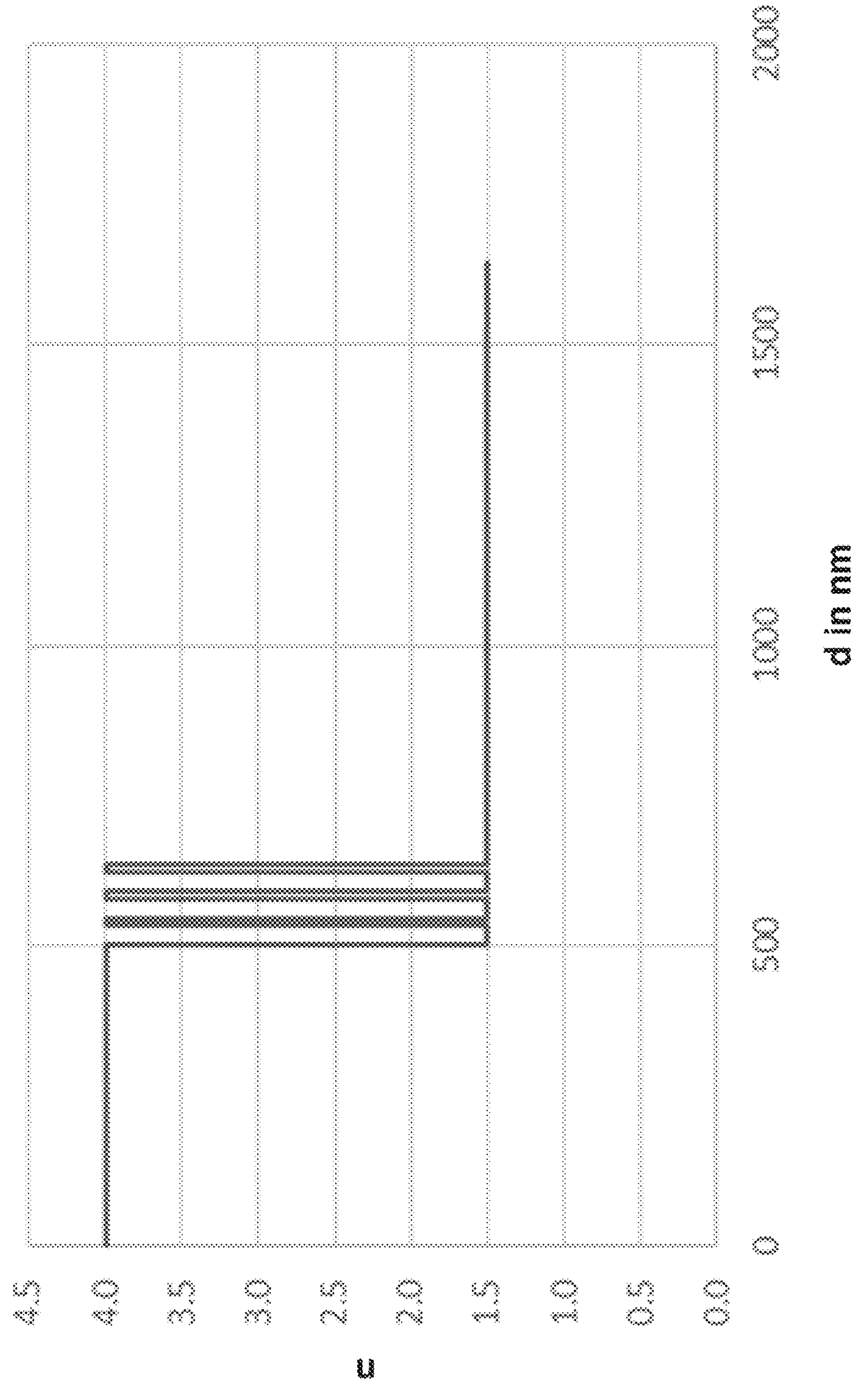
Figure 5B:
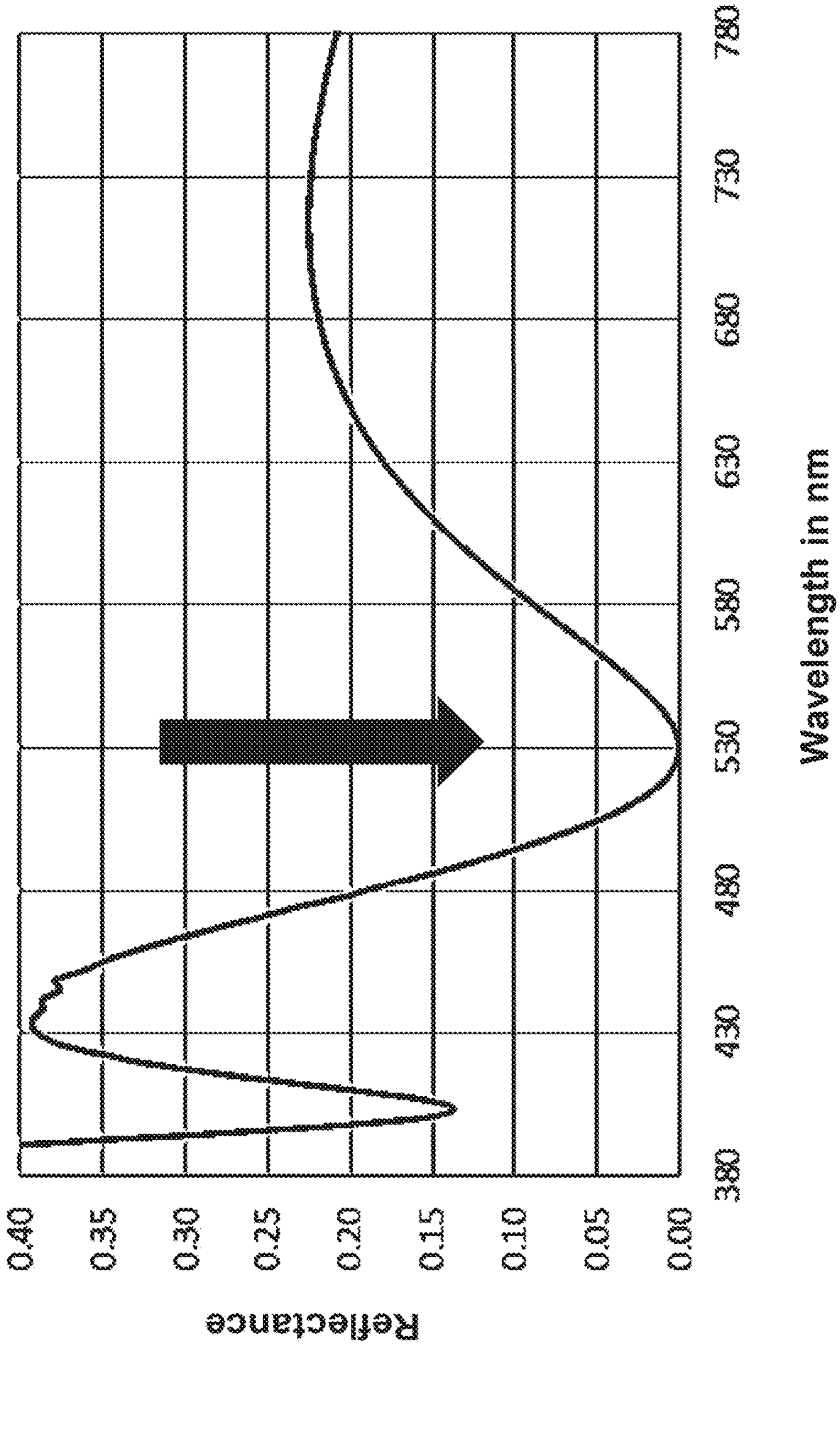

By contrast with FIG. 2, the AR layer 320 in FIG. 4 is produced with an alternating sequence of layers of comparatively low refractive index (composed of SiO2 in the example) and layers of comparatively high refractive index (composed of amorphous silicon in the example), with only two of these layers shown in each case in the simplified illustration. FIG. 5A shows a diagram of the corresponding refractive index progression, where "d" again denotes the thickness based on the stacking direction from the absorber layer 310 to the smoothing layer 330. According to the reflection spectrum shown in FIG. 5B, the effect of the AR layer 320 achieves reduced reflectivity in a wavelength band which is dependent in turn on the layer thicknesses used.

Figure 6:
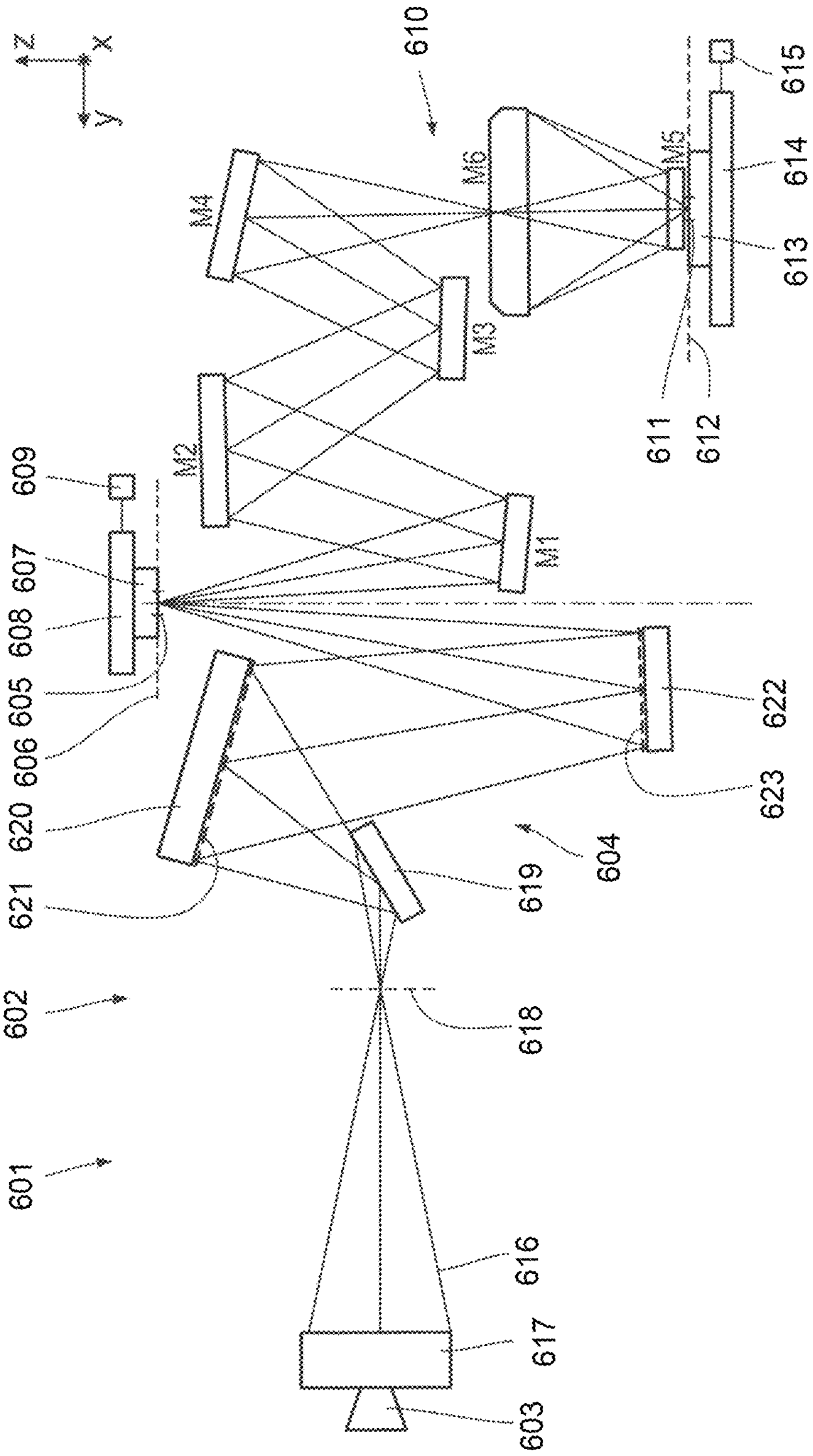
FIG. 6 a schematic diagram of the construction of a microlithographic projection exposure apparatus designed for operation in the EUV.

FIG. 6 shows, as an example of an optical system in which one or more mirrors of the invention can be provided, the possible construction of a microlithographic projection exposure apparatus designed for operation in the EUV in schematic form in meridional section. However, the invention, in other applications, can also be advantageously implemented in a projection exposure apparatus designed for operation in the DUV (i.e. at wavelengths less than 250 nm, in particular less than 200 nm) or else in another optical system.

In accordance with FIG. 6, the projection exposure apparatus 601 comprises an illumination device 602 and a projection lens 610. One embodiment of the illumination device 602 of the projection exposure apparatus 601 has, in addition to a light or radiation source 603, an illumination optical unit 604 for illuminating an object field 605 in an object plane 606. In an alternative embodiment, the light source 603 may also be provided as a module separate from the rest of the illumination device. In this case, the illumination device does not comprise the light source 603. What is exposed here is a reticle 607 disposed in the object field 605. The reticle 607 is held by a reticle holder 608. The reticle holder 608 is displaceable via a reticle displacement drive 609, in particular in a scanning direction. By way of illustration, FIG. 6 shows a Cartesian xyz coordinate system. x direction runs perpendicularly to the plane of the drawing. y direction runs horizontally, and z direction runs vertically. Scanning direction runs in y direction in FIG. 6. z direction runs perpendicularly to the object plane 606.

The projection lens 610 serves for imaging the object field 605 into an image field 611 in an image plane 612. A structure on the reticle 607 is imaged on a light-sensitive layer of a wafer 613 arranged in the region of the image field 611 in the image plane 612. The wafer 613 is held by a wafer holder 614. The wafer holder 614 is displaceable by way of a wafer displacement drive 615, in particular in y direction. The displacement, firstly, of the reticle 607 by way of the reticle displacement drive 609 and, secondly, of the wafer 613 by way of the wafer displacement drive 615 can be synchronized with one another.

The radiation source 603 is an EUV radiation source. The radiation source 603 in particular emits EUV radiation, which is also referred to below as used radiation or illumination radiation. In particular, the used radiation has a wavelength in the range between 5 nm and 30 nm. The radiation source 603 can be for example a plasma source, a synchrotron-based radiation source or a free electron laser (FEL). The illumination radiation 616 emanating from the radiation source 603 is focused by a collector 617 and propagates through an intermediate focus in an intermediate focal plane 618 into the illumination optical unit 604. The illumination optical unit 604 comprises a deflection mirror 619 and, arranged downstream thereof in the beam path, a first facet mirror 620 (having schematically indicated facets 621) and a second facet mirror 622 (having schematically indicated facets 623).

The projection lens 610 comprises a plurality of mirrors Mi (i=1, 2, . . . ), which are consecutively numbered in accordance with their arrangement in the beam path of the projection exposure apparatus 601. In the example illustrated in FIG. 6, the projection lens 610 comprises six mirrors M1 to M6. Alternatives with four, eight, ten, twelve or a different number of mirrors Mi are also possible. The penultimate mirror M5 and the last mirror M6 each have a through opening for the illumination radiation 16. The projection lens 610 is a doubly obscured optical unit. The projection lens 610 has an image-side numerical aperture that is greater than 0.5 and may also be greater than 0.6, and may be for example 0.7 or 0.75.

Even though the invention has been described on the basis of specific embodiments, numerous variations and alternative embodiments will be apparent to a person skilled in the art, for example through combination and/or exchange of features of individual embodiments. Accordingly, such variations and alternative embodiments are also encompassed by the present invention, and the scope of the invention is restricted only within the scope of the appended patent claims and equivalents thereof.

What is claimed is:

1. A mirror having an optical effective surface, comprising:

a reflection layer system for reflecting electromagnetic radiation having an operating wavelength that is incident on the optical effective surface;

a mirror substrate produced from a mirror substrate material and containing structures having a refractive index differing from a refractive index of the mirror substrate material surrounding the structures; and a layer stack between the mirror substrate and the reflection layer system;

wherein the layer stack has, successively in a stacking direction from the mirror substrate to the reflection layer system, an absorber layer, an anti-reflection (AR) layer and a smoothing layer.

2. The mirror as claimed in claim 1, wherein the absorber layer has transmittance of less than 10-5 for at least one measurement wavelength in a range from 400 nm to 750 nm.

3. The mirror as claimed in claim 1, wherein the absorber layer has a thickness in a range from 50 nm to 2 μm.

4. The mirror as claimed in claim 1, wherein the absorber layer includes at least one material from the group consisting essentially of amorphous silicon (a-Si), non-oxidic and non-nitridic a-Si compounds, the metals tantalum (Ta), titanium (Ti), chromium (Cr), nickel (Ni), aluminum (Al), and alloys of said metals.

5. The mirror as claimed in claim 1, wherein the smoothing layer includes a material from the group consisting essentially of silicon dioxide ($SiO_2$), $SiO_x$ compounds, hafnium dioxide ($HfO_2$), titanium dioxide ($TiO_2$), amorphous silicon (a-Si), and crystalline silicon (c-Si).

6. The mirror as claimed in claim 1, wherein the AR layer has an average refractive index between an average refractive index of the smoothing layer and an average refractive index of the absorber layer.

7. The mirror as claimed in claim 1, wherein the AR layer has a refractive index that rises or falls successively in stacking direction between an average refractive index of the absorber layer and an average refractive index of the smoothing layer.

8. The mirror as claimed in claim 1, wherein the AR layer has an alternating sequence of layers of comparatively low refractive index and layers of comparatively high refractive index.

9. The mirror as claimed in claim 1, wherein the AR layer has an alternating sequence of layers of silicon dioxide ($SiO_2$) and layers of amorphous silicon (a-Si).

10. The mirror as claimed in claim 1, further comprising a piezoelectric layer disposed between the mirror substrate and the reflection layer system and configured to produce a locally variable deformation in response to an electrical field applied via electrode arrangements.

11. The mirror as claimed in claim 10, wherein the structures are formed at least partly by electrodes of one of the electrode arrangements.

12. The mirror as claimed in claim 1, configured for an operating wavelength of less than 30 nm.

13. The mirror as claimed in claim 12, configured for an operating wavelength of less than 15 nm.

14. The mirror as claimed in claim 1, configured as a mirror for a microlithographic projection exposure apparatus.

15. A method of producing a mirror as claimed in claim 1, comprising:

providing a mirror substrate produced from a mirror substrate material and containing structures having a refractive index differing from a refractive index of the mirror substrate material surrounding the structures;

applying a layer stack atop the mirror substrate, wherein the layer stack has, successively, in a stacking direction, an absorber layer, an AR layer and a smoothing layer; and applying a reflection layer system configured to reflect incident electromagnetic radiation having an operating wavelength; and conducting at least one interferometry pass measurement using electromagnetic measurement radiation during production of the mirror.

16. An optical system comprising a mirror as claimed in claim 1.

17. The optical system as claimed in claim 16, configured either as an illumination device or a projection lens of a microlithographic projection exposure apparatus.

18. A microlithographic projection exposure apparatus comprising an illumination device and a projection lens, wherein the projection exposure apparatus comprises an optical system as claimed in claim 16.

* * * * *